United States Patent [19]

Benenati et al.

[11] Patent Number: 4,680,527

[45] Date of Patent: Jul. 14, 1987

[54] ELECTRICAL BATTERY INCLUDING APPARATUS FOR CURRENT SENSING

[75] Inventors: Robert L. Benenati, Tamarac; Wayne K. Moy, Coral Springs, both of Fla.

[73] Assignee: Motorola, Inc., Schaumburg, Ill.

[21] Appl. No.: 894,217

[22] Filed: Aug. 6, 1986

[51] Int. Cl.[4] .................. H02J 7/00; H01M 10/44
[52] U.S. Cl. ............................. 320/2; 320/48; 429/7; 429/93
[58] Field of Search .................. 320/2-4, 320/43, 44, 35, 48; 429/7, 9, 98, 99, 163, 93

[56] References Cited

U.S. PATENT DOCUMENTS

| | | | |
|---|---|---|---|
| 3,484,681 | 12/1969 | Grady, Jr. et al. | 320/44 X |
| 3,736,489 | 5/1973 | Mullersman | 320/35 |
| 4,387,334 | 6/1983 | Loper | 320/44 |
| 4,553,081 | 12/1985 | Koenck | 320/43 |
| 4,628,243 | 12/1986 | Hodgman et al. | 320/2 |

Primary Examiner—R. J. Hickey
Attorney, Agent, or Firm—Mark P. Kahler; Joseph T. Downey; Anthony J. Sarli, Jr.

[57] ABSTRACT

An electrical battery is provided which includes a current sensing resistor situated in series with a plurality of battery cells located within a housing. The respective ends of the plurality of cells are coupled to positive and negative contacts on an external surface of the battery. The respective ends of the current sensing resistor are coupled to first and second sensing contacts on the external surface of the battery. A battery structure is thus provided which is capable of supplying electrical energy while permitting sensing of the magnitude of electrical current drawn from the battery.

3 Claims, 5 Drawing Figures

ELECTRICAL BATTERY INCLUDING APPARATUS FOR CURRENT SENSING

BACKGROUND OF THE INVENTION

This invention relates to batteries for portable radios and other electronic devices. More particularly, the invention relates to batteries which include apparatus for enabling current sensing by a portable radio device or other energy consuming device which is attachable thereto.

To provide electrical energy to portable radio devices, an electrical battery is coupled to the radio. Until this time, such batteries have typically been "two contact" devices such as the Motorola MX-300 battery 10 shown in FIG. 1A. That is, battery 10 includes a positive contact 20 and a negative contact 30. Contacts 20 and 30 are adapted to be coupled to corresponding respective contacts on the portable radio device (not shown) to which battery power is to be supplied. Battery 10 further includes battery charger contacts 40, 50, 60 and 70. In designating battery 10 as a two contact device, any battery contacts which are dedicated to coupling battey 10 to a battery charger are not counted.

FIG. 1B is a schematic diagram of the battery circuit which is contained within battery 10. Battery 10 includes a cell group 80 of six battery cells coupled together in series relationship. A positive terminal at one end of cell group 80 is designated terminal 80A. A negative terminal at the other end of cell group 80 is designated terminal 80B. Positive terminal 80A is coupled to battery contact 20 via intermediate circuitry discussed subsequently. Negative terminal 80B is coupled to battery contact 30.

To prevent battery 10 from overheating should contacts 20 and 30 ever be short-circuited, a thermostat 90 is coupled in series with positive terminal 80A and battery contact 20 as seen in FIG. 1B. Thermostat 90 provides an electrical connection below a certain threshold termperature and provides an open circuit above such threshold temperature. Thermostat 90 is selected to provide an open circuit condition when the temperature of battery 10 exceeds a first threshold temperature which is sufficiently high to indicate the presence of an improper operating condition. For example, thermostat 90 is selected to have a first threshold temperature of 85 degrees Celsius. Thus, when such first threshold temperature is exceeded, an improper operating condition is indicated which results in excessive battery temperatures. Then thermostat 90 opens and removes power from battery contacts 20 and 30.

To further protect battery 10 from high temperature improper operating conditions, a thermo-fuse 100 is coupled in series with a nichrome resistor 110 between contact 20 and thermostat 90 as shown in FIG. 1B. Resistor 110 is typically fabricated as a nichrome strip in conventional batteries. When excessive current is drawn from battery 10 through contacts 20 and 30, resistor 110 heats up. Resistor 110 is situated sufficiently close to thermo-fuse 100 that the heat it generates is transferred to thermo-fuse 100. At normal battery operating temperatures, thermo-fuse 100 exhibits a closed circuit. However, when the temperature of thermo-fuse 100 rises above a selected threshold level designated the second threshold level, then thermo-fuse 100 permanently changes from a closed circuit condition to an open circuit condition. The second threshold temperature is generally selected to be somewhat higher than the first threshold temperature associated with thermostat 90, such that should thermostat 90 ever fail to open when the first threshold temperature is reached, then thermo-fuse 100 would open when the second threshold temperature is reached to provide failsafe protection.

Battery contacts 40, 50, 60 and 70 are employed for charging battery 10. Battery contact 40 is coupled via a diode 120 to battery terminal 80A. It is seen that resistor 110, thermo-fuse 100, and thermostat 90 are also in line with diode 120 to provide protection against excessive battery temperature during battery charging. The polarity of diode 120 is selected to prevent cell group 80 from discharging into a battery charger (not shown) which is coupled to battery contacts 40 and 70.

A coding resistor 130 is coupled between contact 50 and terminal 80B which is designated as ground or reference. The value of resistor 130 is arbitrarily selected to indicate the capacity of cell group 80 to the battery charger so that the charger can send the appropriate magnitude of charging current to cell group 80. For example, assigning a value to resistor 130 of 500 ohms would indicate to the charger that cell group 80 exhibits a capacitor of 500 maH. Assigning a value of 1000 ohms to resistor 130 indicates that cell group 80 exhibits a capacity of 1000 maH. The charger, which is coupled to contact 50, senses the value of resistor 130, determines the capacity of cell group 80 and then sends the appropriate charging current to cell group 80 corresponding to the determined capacity of such cell group.

The battery charger which is coupled to conventional battery 10 must make a determination of when it is appropriate to discontinue charging. To facilitate this determination, battery 10 is provided with a thermistor 140 coupled between battery contact 60 and reference 80B. As battery charging progresses, the temperature of battery 10 rises until it reaches a temperature at which charging is complete. To proceed higher than this temperature would indicate that the battery is overcharged perhaps resulting in substantial battery damage. To prevent such overcharging, the charger is coupled to battery contact 60 to permit the charger to sense the resistance of thermistor 140 and thus determine the temperature of battery 10. When the charger determines that a battery temperature is reached which indicates that the battery is fully charged, then charging is discontinued.

Although conventional battery 10 permits a battery charger to determine certain battery parameters, namely charging capacity and charging temperature, battery 10 does not readily and efficiently permit a radio or other current consuming device coupled to main battery contacts 20 and 30 to determine battery operating parameters such as current drain due to operation of such radios or other device.

BRIEF SUMMARY OF THE INVENTION

One object of the present invention is to provide a battery which permits sensing of operating parameters of the battery such as the current drain experienced by the battery.

Another object of the present invention is to provide a battery which permits such current drain sensing in a safe and efficient manner.

In one embodiment of the invention, a multicell battery adapted for interconnection to an energy consuming electronic device is provided. The battery includes a battery housing having an external surface. The battery further includes a plurality of cells coupled together in series and situated in the housing. Positive and negative electrical terminals are situated at opposed ends of the plurality of cells. First and second electrical contacts are situated on the external surface of the battery housing and are coupled to the positive and negative terminals, respectively. A first resistor having opposed ends is connected in series between two adjacent cells of the plurality of cells to form the connection between the adjacent cells. Third and fourth elctrical contacts are situated on the external surface of the battery housing, each coupled to a respective end of the first resistor.

The features of the invention believed to be novel are specifically set forth in the appended claims. However, the invention itself, both as to its structure and method of cooperation, may best be understood by referring to the following description and the accompanying drawings.

DETAILED DESCRIPTION OF THE INVENTION

Figure 2A:
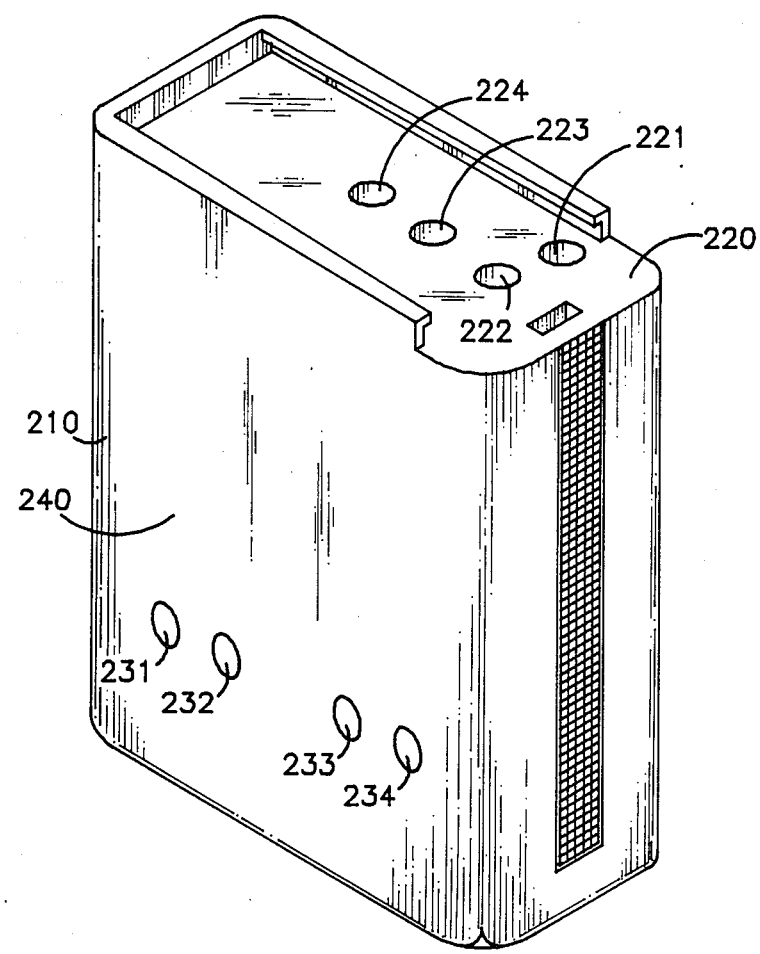
FIG. 2A is a perspective view of the battery of the present invention.

Turning now to FIG. 2A, a perspective view of one embodiment of the battery of the present invention is shown as battery 200. Battery 200 includes a housing 210 made of a material having substantial structural integrity, such as polycarbonate for example, which is sufficiently durable to protect battery cells which are housed therein. Battery housing 210 includes an external surface 220 on which radio contacts 221, 222, 223 and 224 are situated. Such radio contacts 221–224 are electrical contacts which permit the battery to interface with and couple to a radio device or other power consuming device (not shown). One radio device which is connectable to battery 200 is shown in FIG. 4A of the copending U.S. patent application Ser. No. 893,751 entitled "Four Contact Battery Device" by Bresin et al., filed concurrently herewith and assigned to the present assignee. Although the term radio contacts is employed above, those skilled in the art will realize that these contacts are usable to couple battery 200 to power consuming devices other than radios. In this invention, particular ones of radio contacts 221–224 permit the supply of battery power and battery operation information to a radio or other device which is connected to such contacts. Radio contacts are divided into two groups, "power contacts" and "information contacts". Radio contacts 221 and 224 are designated as "power contacts", and radio contacts 222 and 223 are designated "information contacts". The internal connections of battery cells and related structures to such power contacts 221 and 224, and to information contacts 222–223 will become clear upon studying the subsequent discussion of FIG. 2B.

Figure 1A:
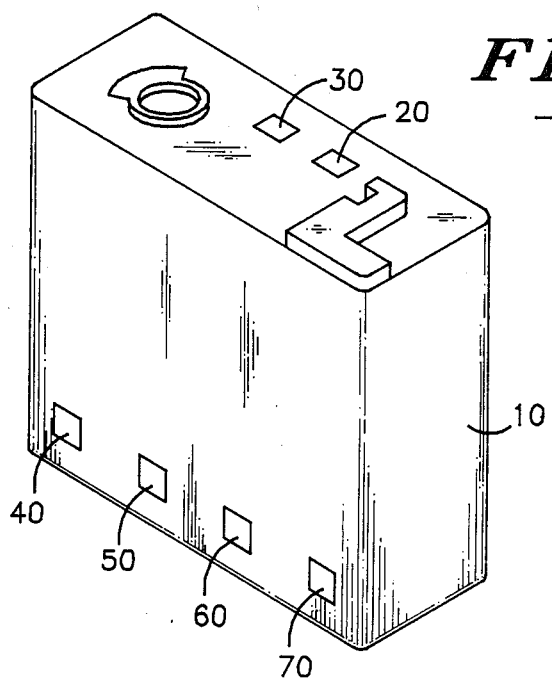
FIG. 1A is a perspective view of a conventional battery.
Figure 1B:
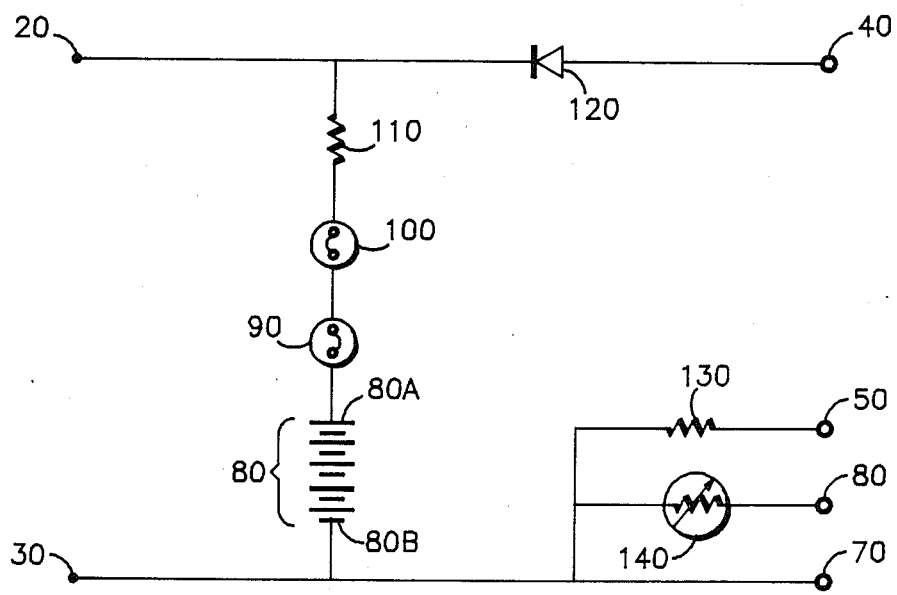
FIG. 1B is a schematic diagram of the circuit for the battery of FIG. 1A.

Battery 200 includes battery charger contacts 231, 232, 233 and 234 which are employed to interface battery 200 to a battery charger (not shown) in substantially the same manner as battery charger contacts 40, 50, 60 and 70, respectively, are used in battery 10 of FIGS. 1A and 1B. Battery charger contacts 231–234 are situated on an external surface 240 of battery 200 different from external surface 220 on which radio contacts 221–224 are situated. Battery charger contacts 231–234 are discussed in more detail subsequently.

Figure 2B:
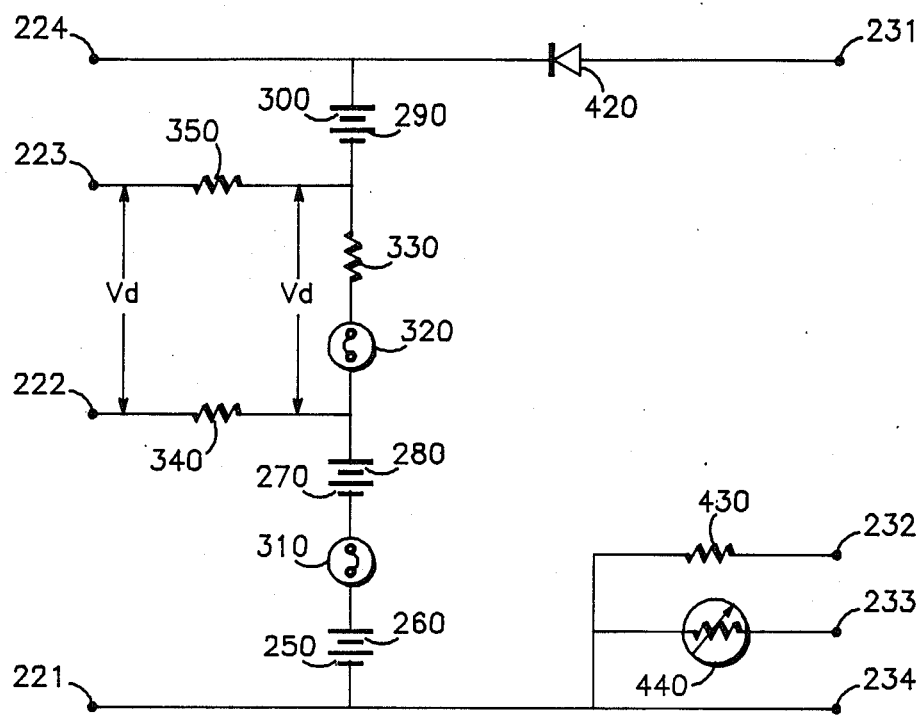
FIG. 2B is a schematic diagram of the battery of FIG. 2A.

FIG. 2B is a schematic diagram of the circuitry of battery 200. The radio contacts 221–224 and charger contacts 231–234 of the pespective view of the FIG. 2A battery are shown schematically in FIG. 2B. using the same numerals for contacts 221–224 and 231–234.

In the embodiment of FIG. 2B, battery 200 includes six battery cells 250, 260, 270, 280, 290 and 300 which are coupled together in series relationship as shown. Other electrical circuit elements, such as thermostat 310, thermo-fuse 320 and resistor 330 are interspersed in series relationship among cells 250–300. Each of cells 250–300 includes a positive and a negative terminal. The negative terminal at one end of the series chain of cells 250–300, namely the negative terminal of cell 250, is coupled to power contact 221. The positive terminal at the remaining end of the series chain of cells 250–300, namely the positive terminal of cells 300, is coupled to power contact 224. In this manner, the series combined voltage of cells 250–300 is provide between power contacts 221 and 224. In this example, each of cells 250–300 is a rechargeable NiCd cell with a voltage of 1.25 volts. Thus a total of 7.5 volts is generated across power contacts 221 and 224.

As seen in FIG. 2B, the negative terminal of battery cell 260 is coupled to the positive terminal of battery cell 250. One terminal of a two terminal thermostat 310 is coupled to the positive terminal of battery cell 260. Thermostat 310 is similar to the thermostat 90 discussed in the discussion of FIG. 1A. Thermostat 310 exhibits a closed circuit between its two terminals when the temperature of its environment is below a selected threshold temperature designated the first threshold temperature. However, when the temperature of the environment exceeds the first threshold voltage, then thermostat exhibits an open circuit. To protect battery 200 from excessive operating temperatures, in this example a thermostat with a threshold temperature of 85 degrees Celsius is selected as thermostat 310. Thus, should the temperature of battery 200 ever exceed 85 degrees, then termostat 310 open-circuits resulting in the removal of all supply voltage and power to power contacts 221 and 224.

The remaining terminal of thermostat 310 is coupled to the negative terminal of battery cell 270. The positive terminal of battery cell 270 is coupled to the negative terminal of battery cell 280. The positive terminal of battery cell 280 is coupled to one terminal of a two terminal thermo-fuse 320. Thermo-fuse 320 is similar to the thermo-fuse 100 discussed in the discussion of FIG. 1B. The remaining terminal of thermo-fuse 320 is coupled via a current sensing resistor 330 (discussed later) to the negative terminal of battery cell 290. The positive terminal of battery cell 290 is coupled to the negative terminal of battery cell 300. The positive terminal of battery cell 300 is coupled to power contact 224.

Resistor 330 is located sufficiently close to thermo-fuse 320 such that heat which is generated as current flows through resistor 330 is readily transferred to thermo-fuse 320. Thermo-fuse 320 exhibits a closed circuit between its two terminals when its temperature is below a selected threshold temperature designated the second threshold temperature. However, when the battery temperature exceeds the second threshold voltage, then thermostat exhibits an open circuit. To protect battery 200 from excessive operating temperatures, in this example a thermo-fuse with a threshold temperature greater than the first threshold temperature of thermostat 310 is selected for thermo-fuse 320. For example, a thermo-fuse with a second threshold temperature of 95 degrees Celsius is selected as thermo-fuse 320. Thus, should the temperature of battery 200 ever exceed 95 degrees Celsius, then thermo-fuse 320 open-circuits resulting in the removal of all supply voltage and power to power contacts 221 and 224.

From the subsequent discussion, it will be clear that current sensing resistor 330 will advantageously serve three different functions, namely, providing heat to thermo-fuse 320, current limiting, and of major importance to the present invention, battery current sensing.

Resistor 330 provides current limiting when battery 200 is subjected to short circuit conditions, that is when battery power contacts 221 and 224 are short circuited. It is noted that when battery 200 is subjected to short circuit conditions, it takes a finite amount of time for battery 200 to heat up to the first and second threshold temperature at which thermostat 310 and thermo-fuse 320 are triggered, respectively. Thus, during the time period while the short circuited battery is heating up before the thermostat 310 or thermo-fuse 320 is triggered, battery 200 would attempt to generate infinite current limited only by the relatively low internal resistances of the individual battery cells 250-300, but for the presence of resistor 330. However, with resistor 330 in series with battey cells 250-300 as shown, when battery contacts are short circuited, the current generated by the battery is limited by resistor 330.

To permit sensing of the current drawn from battery 200 by a radio device coupled to power contacts 221 and 224, information contacts 222 and 223 are coupled to the opposite ends of current sensing resistor 330. More specifically, information contact 222 is coupled via a current limiting resistor 340 through thermo-fuse 320 to one end of resistor 330 as shown in FIG. 2B. Information contact 223 is coupled via a current limiting resistor 350 to the remaining end of resistor 330. A voltage directly proportional to the amount of current drawn from battery 200 is generated at information contacts 222 and 223. Since the resistance of resistor 330 and any resistance exhibited by thermo-fuse 320 is known, and since the resistance of resistors 350 and 360 are known, once the voltage between information contacts 222 and 223 is known, the current drawn by battery 200 is readily determined.

In this embodiment of the invention, the value of resistance of current sense resistor 330 is selected to be approximately 100 mOhms. Of course, lower values of resistance may be used for resistor 330 providing the selected resistance is not so low as to substantially degrade the current limiting capability of such resistor. Higher values of resistance than the 100 mOhm resistor used in this example may also be used as resistor 330 providing such higher resistances are not so high as to substantially increase the effective internal resistance exhibited by the total battery of cells 250-300 to the point where the efficiency of cells 250-300 is significantly reduced.

As mentioned above, a current limiting resistor 340 is situated in the line between information contact 222 and resistor 330. While current sensing could be achieved by directly connecting information contact 222 to resistor 330, such an arangement would leave the battery less protected from excessive current in the event of a short circuit between information contact 222 and power contact 224 or between information contact 222 and power contact 221. In a similar manner, a current limiting resistor 350 is situated in the line between information contact 223 and current sensing resistor 330. While current sensing could be achieved by directly connecting information contact 223 to resistor 330, such an arrangement would leave the battery less protected from excessive current in the event of a short circuit between information contact 223 and power contact 224 or between information contact 223 and power contact 221.

It is noted that in the event of a short circuit between information contact 223 and power contact 224, neither thermostat 310 nor thermo-fuse 320 are in the loop thus formed by such short circuit. Thus the inclusion of resistor 350 in such loop to limit short circuit current is advantageous. In this particular example, the resistances of resistors 340 and 350 are selected to be 270 ohms. Lower values for resistors 340 and 350 may be employed providing such rsistances are not so low as to substantially degrade the above discussed current limiting capabilities. In applications where such current limiting capabilities are not required, resistor 340 and 350 are replaced by direct connections from information contacts 222 and 223 to the opposed ends of resistor 330, respectively.

It is noted that although in the particular embodiment shown in FIG. 2, current sensing resistor 330 is shown as being situated between the negative terminal of battery cell 290 and the positive terminal of adjacent battery 280, such current sensing resistor 330 may also be located at other positions within battery 200. However, in order to properly provide current sensing capability, resistor 200 must be located in series with the battery cells 250-300 and be coupled to adjacent cells. For purposes of this document, the term "adjacent" is used to designate two battery cells of the series chain of cells 250-300 which are next to one another electrically. That is, one cell is adjacent another cell which is its nearest electrical neighbor. For example, cell 280 is adjacent cell 290 and cell 280 is also adjacent cell 270.

As seen in FIG. 2B, battery 200 includes several components which assist in the charging of such battery, namely diode 420, coding resistor 430 and thermistor 440 which are coupled to charger contacts 231, 232, and 233, respectively. These components are referred to as the charger portion of the battery 300 and are arranged in a manner similar to the charger portion of battery 10 of FIG. 1B, already discussed. For clarity, it is noted that diode 420, coding resistor 430, and thermistor 440 of FIG. 2B correspond to diode 120, coding resistor 130 and thermistor 140 of FIG. 1B. Charger contacts 231, 232, 233 and 234 of FIG. 2B correspond to charger contacts 40, 50, 60 and 70 of FIG. 1A, respectively. Since the charger portion of battery 200 is substantially similar to the charger portion of battery 10, it wil not be discussed further. Those skilled in the art will appreciate that should batery 200 be fabricated with nonrechargeable primary cells, then the charger portion is conveniently eliminated from battery 200.

Figure 3:
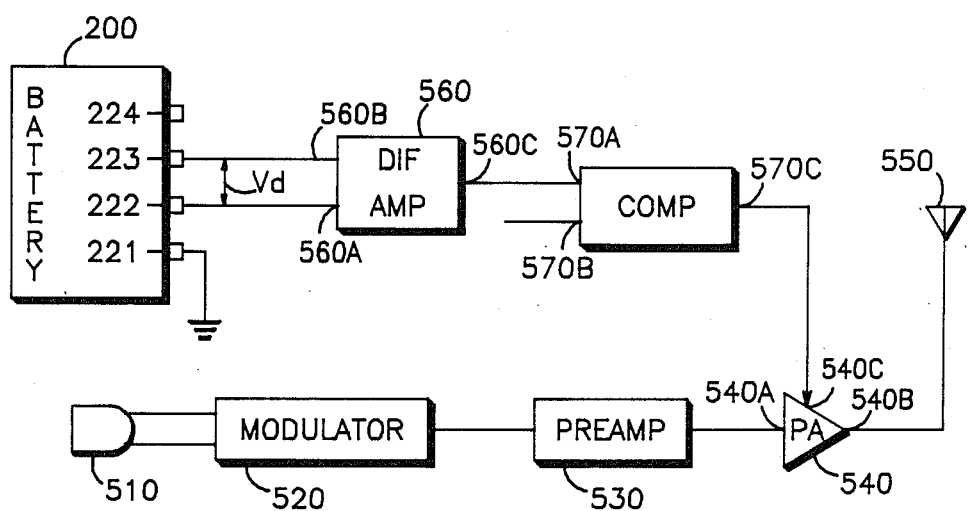
FIG. 3 is a block diagram of a power amplifier current foldback system to illustrate one application of the battery of the present invention.

FIG. 3 is a block diagram of a system 500 which employs the battery current sensing capabilities provided by battery 200 to achieve "foldback" of the power output of a radio frequncy transmitter. The utility of battery 200 is thus demonstrated. Power "foldback" is defined as the controlled reduction of radio frequency power output of a radio frequency amplifier during periods of time when selected undesired operating conditions, such as excessive power supply current drain or power amplifier output impedance matching, are present.

In system 500, components 510-570 are typically situated within a portable radio device, although other applications are possible. In system 500, a microphone 510 is coupled to the input of a modulator 520, for purposes of this example, modulator 520 is an FM modulator although virtually any type of modulator could be employed as modulator 520. When an audio signal is provided to microphone 510, modulator 520 generates a modulated radio frequency (RF) signal at its output. A preamplifier 530 is coupled to the output of modulator 520 to amplify the modulated radio frequency signal to a level appropriate for further amplification by RF power amplifier 540, the input 540A of which is coupled to the output of preamplifier 530. RF power amplifier 540 provides an amount of amplification which varies according to a control signal provided to control input 540C. For example, when the control signal provided to control input 540B is a logical zero, then amplifier 540 amplifies the modulated RF signal provided at input 540A to the extent necessary to generate a two (2) watt RF modulated at output 540B. When the control signal provided to control input 540B is a logical one, then amplifier 540 amplifies the modulated RF signal provided at input 540A to the extent necessary to generate a one half ($\frac{1}{2}$) watt RF modulated signal at output 540B. The output 540B of amplifier 540 is coupled to an antenna 550 to radiate the amplified RF signal to a particular coverage area.

Battery 200 is used to supply electrical energy to the various devices of system 500. The positive power contact 224 of battery 200 is coupled to modulator 520, preamplifier 530, power amplifier 540 and the other devices of system 500 (connections not shown) to provide electrical supply power to such devices. The negative power contact 221 is coupled to ground.

To sense the current flow from battery 200 across power contacts 221 and 224, information contacts 222 and 223 are coupled to the two inputs 560A and 560B, respectively, of a differential amplifier 560. It will be recalled from the discussion of FIG. 2B that information contacts 222 and 223 are coupled across the respective ends of current sensing resistor 330 which is in series with battery power contacts 221 and 224. The entire current which is generated by battery 200 flows through resistor 330. Since the resistance of resistor 330 is known (100 mOhm), the differential voltage, $V_d$, appearing across current sensing resistor 330 includes indicia of the current which is flowing through battery 200. Since resistors 340 and 350 exhibit the same small resistance, the differential voltage appearing across information contacts is still $V_d$.

Returning again to FIG. 3, differential amplifier 560 determines the differential voltage between the voltages provided to its respective inputs 560A and 560B and provides such differential voltage, namely $V_d$, at its output 560C. Differential amplifier output 560C is coupled to one input 570A of a two input comparator 570 such that the differential voltage $V_d$ is provided thereto. It will be recalled that $V_d$ includes indicia of the current drain from battery 200. A selected reference voltage, $V_{ref}$, is supplied to the remaining reference input 570B of comparator 570.

$V_{ref}$ is determined as follows. A maximum desired current drain, $I_{max}$, from battery 200 is selected. Factors which are usable in determining the value of $I_{max}$ are the capacity of the particular battery 200 and the normal current drain of the load coupled to power contacts 224 and 221 under typical load operating conditions. In this case, $I_{max}$ would be selected to be a value of battery current which, if exceeded, would indicate that the load is drawing excessive current. $V_{ref}$ is selected to be the a value of $V_d$ which corresponds to a quantity of current $I_{max}$ being drawn from battery 200 by the load.

In view of the above, system 500 perform as follows. When normal quantities of current are being drawn from battery 200 by the load coupled thereto, that is, when the current drain from battery 200 is less than $I_{max}$, then the differential voltage $V_d$ at comparator input 570A is less than the $V_{ref}$ voltage at comparator input 570B. Therefore, the control voltage at the output 570C and the control input 540C of amplifier 540 is a logical zero. Under these normal operating conditions, the output power of amplifier 540 remains at the nominal level, for example two watts.

However, when quantities of current greater than normal are being drawn from battery 200 by the load coupled thereto, that is, when the current drain from battery 200 is greater than $I_{max}$, then the differential voltage $V_d$ at comparator input 570A is greater than the $V_{ref}$ voltage at comparator input 570B. Therefore, the control voltage at the output 570C and the control input 540C of amplifier 540 changes from a logical zero to a logical one. Under these abnormal operating conditions where excessive load current is being drawn, the output power of amplifier 540 is reduced or "folded back" to a lesser level, for example one half ($\frac{1}{2}$) watt.

The foregoing describes an battery apparatus for supplying electrical power which provides both direct current power and structure for enabling the measuring of current which is being drawn from such battery apparatus. The battery apparatus includes structures which permit such current drain sensing to be conducted in a safe manner.

While only certain preferred features of the invention have been shown by way of illustration, many modifications and changes will occur to those skilled in the art. It is, therefore, to be understood that the present claims are intended to cover all such modifications and changes which fall within the true spirit of the invention.

I claim:

1. A multicell battery adapted for interconnection to an energy consuming electronic device comprising:
   a battery housing having an external surface;
   a plurality of cells coupled together in series and situated in said housing and including positive and negative electrical terminals at opposed ends of said plurality of cells;
   first and second electrical contacts situated on the external surface of said battery housing and coupled to said positive and negative terminals, respectively;
   a first resistor connected in series between two adjacent cells of said plurality of cells to form the connection between said adjacent cells, said resistor having opposed ends, and third and fourth electrical contacts situated on the external surface of said battery housing, each coupled to a respective end of said first resistor.

2. The battery of claim 1 including a second resistor coupling one end of said first resistor to said third contact.

3. The battery of claim 2 including a third resistor coupling the remaining end of said first resistor to said fourth contact.

* * * * *